(12) United States Patent
Mori et al.

(10) Patent No.: US 6,403,199 B2
(45) Date of Patent: *Jun. 11, 2002

(54) INSULATING CERAMIC, MULTILAYER CERAMIC SUBSTRATE, CERAMIC ELECTRONIC PARTS AND LAMINATED CERAMIC ELECTRONIC PARTS

(75) Inventors: Naoya Mori, Omihachiman; Osamu Chikagawa, Moriyama, both of (JP)

(73) Assignee: Murata Manufacturing Co., Ltd (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/789,116

(22) Filed: Feb. 20, 2001

(30) Foreign Application Priority Data

Mar. 6, 2000 (JP) .................... 2000-060800

(51) Int. Cl.[7] .................................. B32B 15/00
(52) U.S. Cl. ........................ 428/209; 501/10; 501/11
(58) Field of Search ................ 501/11, 10, 32

(56) References Cited

U.S. PATENT DOCUMENTS 3,899,340 A * 8/1975 Malmendier ............... 501/10
4,355,114 A * 10/1982 Hang et al. ................ 501/10
5,079,194 A * 1/1992 Jean et al. ................. 501/17
5,256,470 A * 10/1993 Jean et al. ................. 428/209
6,329,715 B1 * 12/2001 Hayashi ..................... 257/528

FOREIGN PATENT DOCUMENTS

| EP | 0480468 A1 | 4/1992 |
| GB | 2355260 A | 4/2001 |
| JP | 60113984 A | 6/1985 |
| JP | 05-238774 | 9/1993 |

* cited by examiner

Primary Examiner—Deborah Jones
Assistant Examiner—Gwendolyn Blackwell-Rudasill
(74) Attorney, Agent, or Firm—Dickstein Shapiro Morin & Oshinsky LLP

(57) ABSTRACT

An insulating ceramic includes a fired mixture of a MgO—$MgAl_2O_4$ ceramic and a borosilicate glass, in which $MgAl_2O_4$ crystal phase and at least one of $Mg_3B_2O_6$ crystal phase and $Mg_2B_2O_5$ crystal phase are the major crystal phases. The insulating ceramic can be obtained by firing at low temperatures of 1000° C. or less, can be fired in conjunction with Ag or Cu, has a high Q-value and satisfactory mechanical strength, and is suitable for use at high frequencies.

21 Claims, 6 Drawing Sheets

INSULATING CERAMIC, MULTILAYER CERAMIC SUBSTRATE, CERAMIC ELECTRONIC PARTS AND LAMINATED CERAMIC ELECTRONIC PARTS

BACKGROUND OF THE INVENTION

1. Field of the Invention

The present invention relates to an insulating ceramic for use in, for example, multilayer circuit boards. Specifically, the present invention relates to a high-frequency insulating ceramic which is advantageously used in, for example, composite multilayer circuit boards equipped with semiconductor devices and various electronic parts and which can be obtained by firing in conjunction with conductive materials such as copper and silver, as well as to a multilayer ceramic substrate, a ceramic electronic part, and a laminated ceramic electronic part each using the insulating ceramic.

2. Description of the Related Art

Recent tendencies to accelerate the use of electronic equipment in higher frequencies keep on expanding. With such demands for the accelerating, higher-density mounting and higher-density packing of electronic parts which are used in such electronic equipment are still increasing. To satisfy these demands, multilayer circuit boards are conventionally used as substrates on which semiconductor devices and various electronic parts are mounted. In such a multilayer circuit board, the substrate houses a conductor circuit and an electronic part functional device to thereby further miniaturize electronic equipment.

Alumina has been conventionally frequently used as a material for constituting the multilayer circuit board.

Alumina has a relatively high firing temperature of 1500° C. to 1600° C., and refractory metals such as Mo, Mo—Mn, and W must be generally used as materials for conductive circuits housed in such a multilayer circuit board composed of alumina.

However, these refractory metals have a high electric resistance. Strong demands have been therefore made for the use of a metal such as copper as a conductive material, which metal has a lower electric resistance and is available at a lower cost than the refractory metals. To use copper as a conductive material, the use of a glass ceramic or crystallized glass which can be obtained by firing at low temperatures of 1000° C. or less has been proposed (e.g., Japanese Unexamined Patent Application Publication No. 5-238774).

However, such known substrate materials which can be obtained by firing at low temperatures have a low mechanical strength and a low Q-value, and the firing process tends to affect the type and proportion of deposited crystal phases of such materials.

SUMMARY OF THE INVENTION

Accordingly, it is an object of the present invention to provide an insulating ceramic which can solve the problems of the conventional technologies, can be obtained by firing at low temperatures, can be obtained by firing in conjunction with conductive materials having relatively low melting points such as silver and copper, has satisfactory mechanical strength and a high Q-value, and is insensitive to the type and proportion of deposited crystal phases.

Another object of the present invention is to provide a multilayer ceramic substrate, a ceramic electronic part and a laminated ceramic electronic part, each of which is composed of the insulating ceramic, which has satisfactory mechanical strength and a high Q-value, and is insensitive to the type and proportion of deposited crystal phases.

After intensive investigations to solve the above problems, the present inventors found that the deposition of $MgAl_2O_4$ crystal phase and $Mg_3B_2O_6$ crystal phase and/or $Mg_2B_2O_5$ crystal phase as major crystal phases can yield a higher Q-value and a higher reliability. This is because the deposition of $Mg_3B_2O_6$ crystal phase and/or $Mg_2B_2O_5$ crystal phase as major crystal phases in addition to $MgAl_2O_4$ crystal phase stabilizes boron in the glass to thereby improve reliability and sinterability. The present invention has been accomplished based on these findings.

Specifically, the present invention provides, in a broad aspect, an insulating ceramic including a fired mixture of a $MgO$—$MgAl_2O_4$ ceramic and a borosilicate glass, in which $MgAl_2O_4$ crystal phase and at least one of $Mg_3B_2O_6$ crystal phase and $Mg_2B_2O_5$ crystal phase are deposited as major crystal phases. In this context, "major" means that of the phases present, the $MgAl_2O_4$ crystal phase and the $Mg_3B_2O_6$ and/or $Mg_2B_2O_5$ crystal phase are present in the greatest amounts.

The borosilicate glass for use in the present invention preferably includes boron oxide, silicon oxide, magnesium oxide and an alkali metal oxide. The combination use of $MgO$—$MgAl_2O_4$ with a glass composition including at least boron oxide ($B_2O_3$), silicon oxide ($SiO_2$), magnesium oxide ($MgO$) and an alkali metal oxide (e.g., $Na_2O$, $K_2O$ or $Li_2O$) allows the $MgAl_2O_4$ crystal phase and $Mg_3B_2O_6$ crystal phase and/or $Mg_2B_2O_5$ crystal phase to deposit as major crystal phases to thereby yield a high Q-value.

In this case, the borosilicate glass preferably includes about 15 to 65% by weight of boron oxide in terms of $B_2O_3$, about 8 to 50% by weight of silicon oxide in terms of $SiO_2$, about 10 to 45% by weight of magnesium oxide in terms of $MgO$ and 0 to about 20% by weight of an alkali metal oxide in terms of $R_2O$, wherein R is an alkali metal.

If the content of boron oxide in borosilicate glass is less than about 15% by weight in terms of $B_2O_3$, the ratio of boron oxide to MgO in the system is low, resulting in decreased deposition of the $Mg_3B_2O_6$ crystal phase and/or $Mg_2B_2O_5$ crystal phase. A high reliability and a satisfactory sinterability may not be obtained.

On the contrary, if the content of boron oxide is more than about 65% by weight, the moisture resistance of the glass may be deteriorated.

If the content of silicon oxide in the glass is less than about 8% by weight in terms of $SiO_2$, the chemical stability of the glass may be deteriorated, and if it exceeds about 50% by weight, the resulting glass may have an increased fusing temperature or a deteriorated sinterability.

A magnesium oxide content in the glass of less than about 10% by weight in terms of MgO may retard crystallization, and a content of more than about 45% by weight may cause crystallization in the manufacture of the glass to thereby deteriorate sinterability.

The alkali metal oxide in the glass acts to decrease the fusing temperature of the glass. However, a content of the alkali metal oxide exceeding about 20% by weight may decrease Q-value.

The $Mg_3B_2O_6$ or $Mg_2B_2O_5$ crystal phase can be selectively deposited by appropriately adjusting the ratio of magnesium oxide to boron oxide in the system in the present invention. Specifically, the $Mg_3B_2O_6$ crystal phase can be deposited when magnesium oxide (MgO) is excess such that the molar ratio of MgO to $B_2O_3$ is more than about 3:1.

To the contrary, the $Mg_2B_2O_5$ crystal phase can be deposited when $B_2O_3$ is excess such that the molar ratio of MgO to $B_2O_3$ is less than about 3:1.

When the molar ratio of MgO to $B_2O_3$ is in the vicinity of 3:1, both the $Mg_3B_2O_6$ and $Mg_2B_2O_5$ crystal phases are deposited.

The borosilicate glass preferably further includes 0 to about 20% by weight of aluminium oxide. The addition of aluminium oxide enhances chemical stability of the glass. However, if the content of aluminium oxide exceeds about 20% by weight, a sufficient sinterability may not be obtained.

Preferably, the borosilicate glass further includes about 30% by weight or less of zinc oxide. The addition of zinc oxide (ZnO) in the above proportion decreases the fusing temperature of the glass, and the insulating ceramic can be obtained by firing at lower temperatures. A content of zinc oxide exceeding about 30% by weight may deteriorate the chemical stability of the glass.

Preferably, the borosilicate glass further includes 0 to about 10% by weight of copper oxide. The addition of copper oxide (CuO) yields the insulating ceramic by firing at lower temperatures. A content of copper oxide exceeding about 10% by weight may result in a decreased Q-value.

The weight ratio of the $MgO-MgAl_2O_4$ ceramic to the borosilicate glass is preferably in a range from about 20:80 to 80:20. A content of the ceramic less than about 20% by weight tends to decrease Q-value. If the content exceeds about 80% by weight, the resulting insulating ceramic may not become sufficiently dense by firing at temperatures of 900° C. to 1000° C.

The $MgO-MgAl_2O_4$ ceramic is preferably represented by $xMgO-yMgAl_2O_4$ where x and y are indicated by weight ratio and satisfy the following conditions: $10 \leq x \leq 90$; $10 \leq y \leq 90$; and x+y=100.

The weight percentage of MgO, x, is specified in a range from about 10 to 90. This is because x exceeding about 90 may invite a problem in moisture resistance of MgO.

If x is less than about 10, a large quantity of an expensive glass may be added for firing at temperatures of 1000° C. or less.

In the sintered ceramic, about 5 to 80% by weight of $MgAl_2O_4$ crystal phase, and about 5 to 70% by weight of $Mg_3B_2O_6$ crystal phase and/or $Mg_2B_2O_5$ crystal phase are preferably deposited. Contents within the above ranges can yield high reliability, satisfactory sinterability, sufficient mechanical strength and a high Q value. A content of $MgAl_2O_4$ crystal phase less than about 5% by weight may deteriorate the strengths of the insulating ceramic. If it exceeds about 80% by weight, the resulting ceramic may not become dense by firing at temperatures of 1000° C. or less.

If the content of the $Mg_3B_2O_6$ crystal phase and/or $Mg_2B_2O_5$ crystal phase is less than about 5% by weight, a reaction between magnesium oxide (MgO) and boron oxide ($B_2O_3$) may not sufficiently proceed, resulting in deteriorated sinterability and reliability and decreased Q-value. To deposit the $Mg_3B_2O_6$ crystal phase and/or $Mg_2B_2O_5$ crystal phase more than about 70% by weight, a large quantity of an expensive glass must be added to thereby increase cost.

In the present invention, a mixture obtained by calcining a glass composition at temperatures of about 700° C. to 1000° C. may be employed as the glass.

The resulting insulating ceramic according to the present invention preferably has a Q-value of 400 or more as determined at a frequency of 10 GHz. If the insulating ceramic has a Q-value of 400 or more at 10 GHz, the ceramic can be advantageously employed in circuit boards for use at high frequencies, for example at frequencies of 1 GHz or more.

In another aspect, the present invention provides a multilayer ceramic substrate which includes a ceramic plate including an insulating ceramic layer composed of the insulating ceramic, and a plurality of inner electrodes formed in the insulating ceramic layer of the ceramic plate.

In the invented multilayer ceramic substrate, a second ceramic layer having a higher dielectric constant than the insulating ceramic layer may be laminated on at least one side of the insulating ceramic layer.

The plurality, of inner electrodes in the invented multilayer ceramic substrate may be laminated via at least part of the insulating ceramic layer to thereby constitute a laminated capacitor.

Preferably, the plurality of inner electrodes include capacitor inner electrodes and coil conductors, and the capacitor inner electrodes being laminated with each other via at least part of the insulating ceramic layer, and the coil conductors being connected to each other to thereby constitute a laminated inductor.

The present invention provides, in a further aspect, a ceramic electronic part which includes the multilayer ceramic substrate and at least one electronic part device which is mounted on the multilayer ceramic substrate and constitutes a circuit with the plurality of inner electrodes.

Specifically, the invented ceramic electronic part may further include a cap fixed on the multilayer ceramic substrate so as to surround the electronic part device. A conductive cap is preferably used as the cap.

The invented ceramic electronic part preferably further includes a plurality of outer electrodes only formed on the underside of the multilayer ceramic substrate, and a plurality of through-hole conductors which are electrically connected to the outer electrode and electrically connected to an inner electrode or the electronic part device.

In yet another aspect, the present invention provides a laminated ceramic electronic part which includes a sintered ceramic composed of the insulating ceramic, a plurality of inner electrodes arrayed inside the sintered ceramic, and a plurality of outer electrodes which is formed on an outer surface of the sintered ceramic and electrically connected to any of the inner electrodes.

The plurality of inner electrodes may be arrayed so as to overlap with each other via a ceramic layer to thereby constitute a capacitor unit in a specific embodiment of the invented laminated ceramic electronic part.

Preferably, the plurality of inner electrodes in the invented laminated ceramic electronic part further includes a plurality of coil conductors connected to each other to thereby constitute a laminated inductor unit, in addition to the inner electrodes constituting the capacitor unit.

DESCRIPTION OF THE PREFERRED EMBODIMENTS

Figure 1:
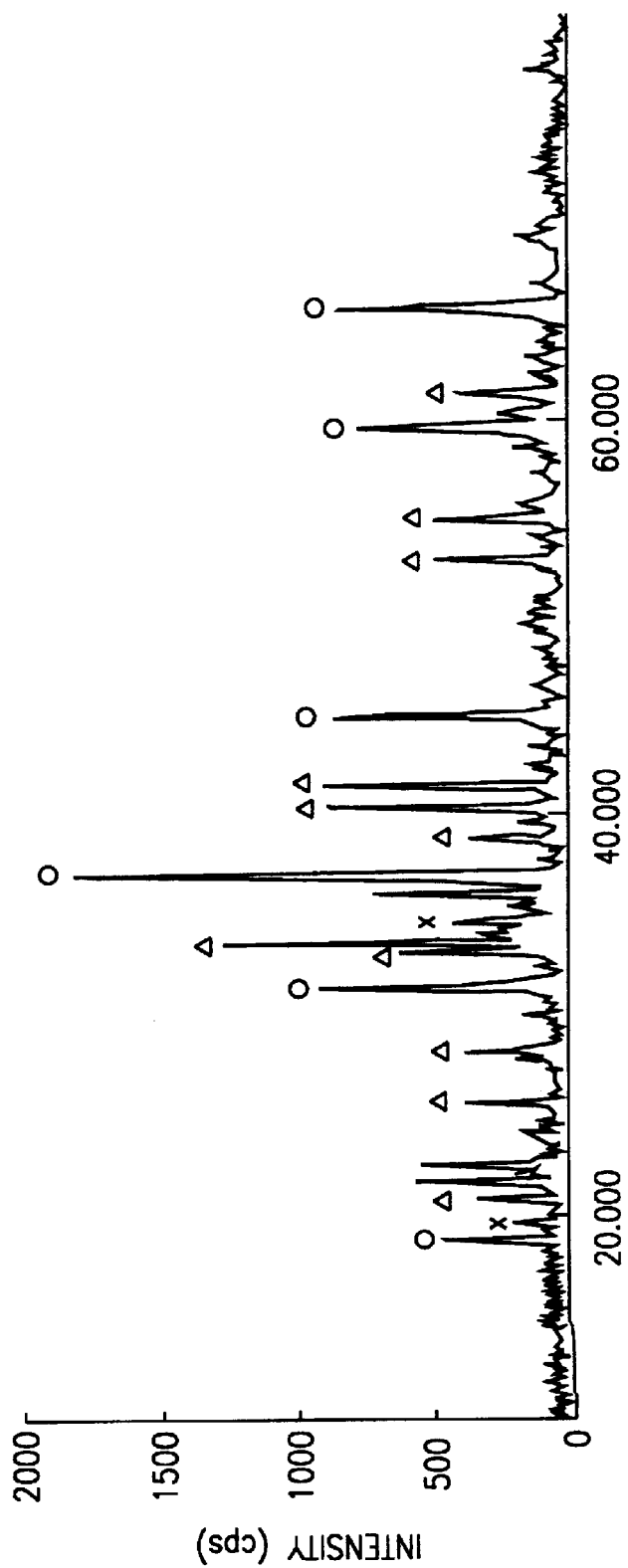
FIG. 1 is a diagram showing the XRD spectrum of insulating ceramic sample number 11 as an example of the present invention.

Initially, examples of the invented insulating ceramic will be described below, followed by configurational embodiments of the invented multilayer ceramic substrate, ceramic electronic part and laminated ceramic electronic part, to illustrate the present invention in further detail.

Starting material powders Mg(OH)$_2$ and Al$_2$O$_3$ were weighed and mixed to yield ultimate sintered ceramics represented by the following compositional formula:

$$xMgO—yMgAl_2O_4$$

wherein x and y are indicated by weight ratio and satisfy the following conditions:

$$10 \leq x \leq 90; \ 10 \leq y \leq 90; \ \text{and} \ x+y=100$$

Each of the mixed powders was wet-mixed for 16 hours and was dried, the resulting mixture was calcined at 1400° C. for 2 hours to yield a calcined compact, and the calcined compact was crushed to yield a ceramic composition.

The above prepared ceramic composition was weighed and was mixed with each of the glasses having a composition indicated in Table 1 in the amount indicated in Table 2. The resulting mixture was then granulated with an appropriate amount of a binder and was shaped at a pressure of 200 MPa to yield a cylindrical molding 12 mm in diameter and 7 mm in thickness. The molding was fired at 900° C. to 1000° C. in the air for 2 hours to thereby yield insulating ceramic samples. Relative dielectric constants and Q-values at 10 GHz of the samples were determined by a technique using a dielectric resonator. The results of these examples are shown in Table 2.

Separately, strip insulating ceramic samples were prepared and were subjected to a three-point bending test pursuant to Japanese Industrial Standards (JIS) C 2141 to evaluate bending strength. The sample according to Example 1 had a high strength of 290 MPa.

Each of the above-prepared insulating ceramics was subjected to powder x-ray diffractometry (XRD) to determine the presence of a MgAl$_2$O$_4$ crystal phase, Mg$_3$B$_2$O$_6$ crystal phase and Mg$_2$B$_2$O$_5$ crystal phase. The results are shown in Table 2 as crystal phases.

In Table 2, symbols "KO", "SP", "SU", and "MG" respectively mean Mg$_3$B$_2$O$_6$, MgAl$_2$O$_4$, Mg$_2$B$_2$O$_5$ and MgO.

TABLE 1

| | (weight %) | | | | | | | | | |
|---|---|---|---|---|---|---|---|---|---|---|
| Glass No. | B$_2$O$_3$ | SiO$_2$ | MgO | Al$_2$O$_3$ | ZnO | BaO | SrO | CaO | Li$_2$O | CuO |
| A | 40 | 14 | — | — | — | 41 | — | — | 5 | — |
| B | 40 | 13 | — | — | — | — | 42 | — | 5 | — |
| C | 30 | 20 | — | — | — | — | — | 45 | 5 | — |
| D | 54 | 19 | 21 | — | — | — | — | — | 6 | — |
| E | 28 | 50 | 17 | — | — | — | — | — | 5 | — |
| F | 40 | 20 | 15 | 5 | — | — | — | — | 20 | — |
| G | 45 | 30 | 10 | 5 | 8 | — | — | — | 2 | — |
| H | 38 | 20 | 19 | 8 | 4 | — | — | — | 9 | 2 |
| I | 41 | 18 | 19 | — | 10 | — | — | — | 10 | 2 |
| J | 41 | 17 | 26 | 5 | 5 | — | — | — | 5 | 2 |
| K | 37 | 24 | 27 | — | — | — | — | — | 10 | 2 |
| L | 15 | 35 | 25 | 5 | 15 | — | — | — | 5 | — |
| M | 65 | 10 | 15 | — | — | — | — | — | 4 | 1 |
| N | 42 | 8 | 25 | 10 | 5 | — | — | — | 8 | 2 |
| O | 38 | 22 | 10 | 5 | 20 | — | — | — | 4 | 1 |
| P | 35 | 10 | 45 | — | 5 | — | — | — | 3 | 2 |
| Q | 45 | 10 | 20 | 20 | — | — | — | — | 3 | 2 |
| R | 30 | 15 | 18 | 5 | 30 | — | — | — | — | 2 |

TABLE 1-continued (weight %)

| Glass No. | $B_2O_3$ | $SiO_2$ | MgO | $Al_2O_3$ | ZnO | BaO | SrO | CaO | $Li_2O$ | CuO |
|---|---|---|---|---|---|---|---|---|---|---|
| S | 35 | 20 | 20 | — | 10 | — | — | — | 5 | 10 |
| T | 35 | — | 30 | 10 | 15 | — | — | — | 8 | 2 |

TABLE 2

| Sample No. | MgO (weight %) | $MgAl_2O_4$ (weight %) | Glass (weight %) | Kind | Firing temperature (° C.) | Major crystal phase | Dielectric constant (∈) | Q-value (@10 GHz) |
|---|---|---|---|---|---|---|---|---|
| 1 | 50 | 50 | 50 | A | 920 | SU, SP | 7.7 | 410 |
| 2 | 50 | 50 | 50 | B | 920 | SU, SP | 7.6 | 430 |
| 3 | 50 | 50 | 50 | C | 920 | SU, SP | 8.4 | 400 |
| 4 | 40 | 60 | 40 | D | 950 | KO, SP | 7.2 | 1000 |
| 5 | 60 | 40 | 20 | D | 1000 | SU, SP | 6.9 | 700 |
| 6 | 50 | 50 | 50 | D | 920 | SU, SP | 7.0 | 2500 |
| 7 | 40 | 60 | 50 | E | 1000 | KO, SP | 7.1 | 800 |
| 8 | 55 | 45 | 65 | E | 950 | KO, SP | 7.3 | 1500 |
| 9 | 60 | 40 | 45 | F | 920 | SU, SP | 7.0 | 700 |
| 10 | 50 | 50 | 50 | G | 950 | SP, SU | 7.2 | 1200 |
| 11 | 50 | 50 | 50 | H | 900 | KO, SP | 7.2 | 3000 |
| 12 | 60 | 40 | 40 | H | 950 | KO, SP | 7.2 | 2500 |
| 13 | 90 | 10 | 65 | I | 1000 | KO, SP | 7.3 | 1200 |
| 14 | 50 | 50 | 50 | I | 900 | SU, SP | 7.2 | 5500 |
| 15 | 50 | 50 | 50 | J | 900 | KO, SP | 7.3 | 4500 |
| 16 | 30 | 70 | 60 | J | 950 | SU, SP | 7.3 | 1200 |
| 17 | 50 | 50 | 50 | K | 900 | KO, SP | 7.3 | 3000 |
| 18 | 70 | 30 | 65 | K | 900 | KO, SP | 7.0 | 1500 |
| 19 | 10 | 90 | 80 | L | 950 | KO, SP | 7.4 | 800 |
| 20 | 30 | 70 | 55 | L | 900 | KO, SP | 7.3 | 1600 |
| 21 | 50 | 50 | 20 | M | 950 | SU, SP | 7.2 | 1200 |
| 22 | 50 | 50 | 50 | N | 950 | KO, SP | 7.1 | 1500 |
| 23 | 65 | 35 | 50 | O | 950 | KO, SP | 7.3 | 1800 |
| 24 | 35 | 65 | 75 | P | 1000 | KO, SP | 7.4 | 2000 |
| 25 | 10 | 90 | 70 | F | 1000 | SU, SP | 7.3 | 850 |
| 26 | 55 | 45 | 75 | Q | 1000 | SU, SP | 7.1 | 1900 |
| 27 | 25 | 75 | 40 | R | 1000 | SU, SP | 7.3 | 900 |
| 28 | 50 | 50 | 50 | S | 900 | KO, SP | 7.1 | 500 |
| 29* | 50 | 50 | 50 | T | — | — | — | — |
| 30* | 50 | 50 | 90 | J | 900 | SP | 6.5 | 150 |
| 31* | 50 | 50 | 10 | J | 1000 | SP, MG | 5.1 | 200 |

*Out of the scope of the invention

Figure 2:
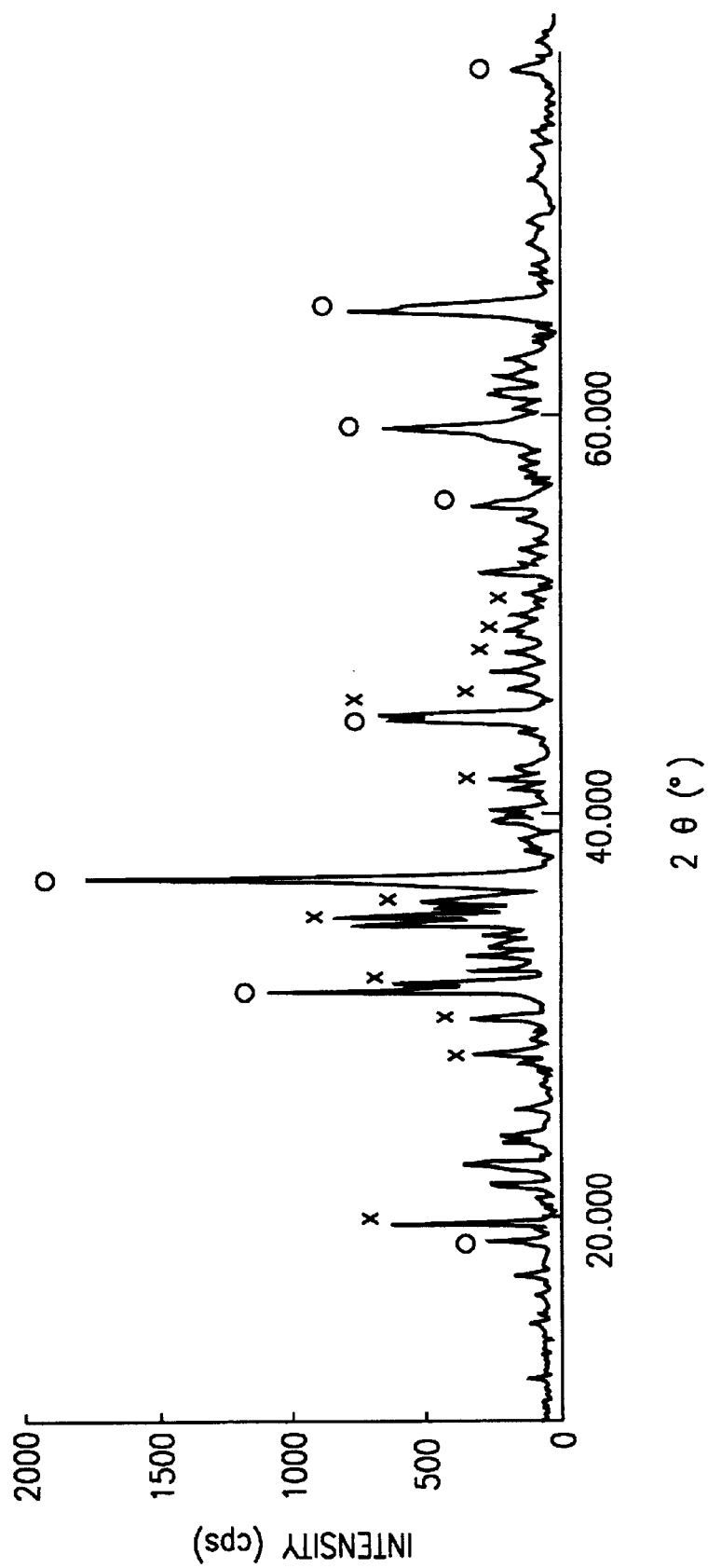
FIG. 2 is a diagram showing the XRD spectrum of insulating ceramic sample number 14 as another example of the present invention.

FIGS. 1 and 2 are diffraction charts of insulating ceramics obtained as sample numbers 11 and 14, as typical examples of the XRD analyses. In FIGS. 1 and 2, symbols "O", "Δ" and "X" respectively mean a peak derived from the $MgAl_2O_4$ crystal phase, a peak derived from the $Mg_3B_2O_6$ crystal phase and a peak derived from $Mg_2B_2O_5$ crystal phase.

Table 2 shows the following findings. Initially, when the $MgAl_2O_4$ crystal phase, and the $Mg_3B_2O_6$ and/or $Mg_2B_2O_5$ crystal phase are deposited as major crystal phases, samples exhibiting a Q-value of 400 or more at 10 GHz can be obtained.

A higher Q value can be obtained by restricting the alkaline earth metal in the borosilicate glass to Mg.

A further higher Q-value can be obtained when the borosilicate glass includes about 15 to 65% by weight of boron oxide in terms of $B_2O_3$, about 8 to 50% by weight of silicon oxide in terms of $SiO_2$, about 10 to 45% by weight of magnesium oxide in terms of MgO and 0 to about 20% by weight of an alkali metal oxide in terms of an oxide.

When the borosilicate glass further comprises 0 to about 20% by weight of aluminium oxide, the resulting sample exhibits a high Q-value and an increased chemical stability of the glass, resulting in easier handling.

When the borosilicate glass further comprises 0 to about 30% by weight of zinc oxide, the resulting sample exhibits a higher Q-value.

A borosilicate glass further comprising 0 to about 10% by weight of copper oxide can yield a sample exhibiting a high Q-value and a satisfactory sinterability.

On the contrary, in the sample number 30 comprising the glass in more than about 80% by weight, amorphous phases in the sintered ceramic are increased and neither SU nor KO are deposited, resulting in a decreased Q-value.

In the sample number 31 comprising the glass less than 20% by weight, neither $Mg_3B_2O_6$ nor $Mg_2B_2O_5$ are deposited, and MgO constitutes a major crystal phase. The resulting ceramic cannot therefore become sufficiently dense by firing at temperatures of 1000° C. or less and a high Q-value cannot be obtained.

In the sample number 29 containing other glass than a borosilicate glass, the glass is chemically unstable and cannot be molded into a sheet. No test sample can be thus prepared.

Next, configurational embodiments of the multilayer ceramic substrate, ceramic electronic part, and laminated ceramic electronic part using the invented insulating ceramic will be illustrated below.

Figure 3:
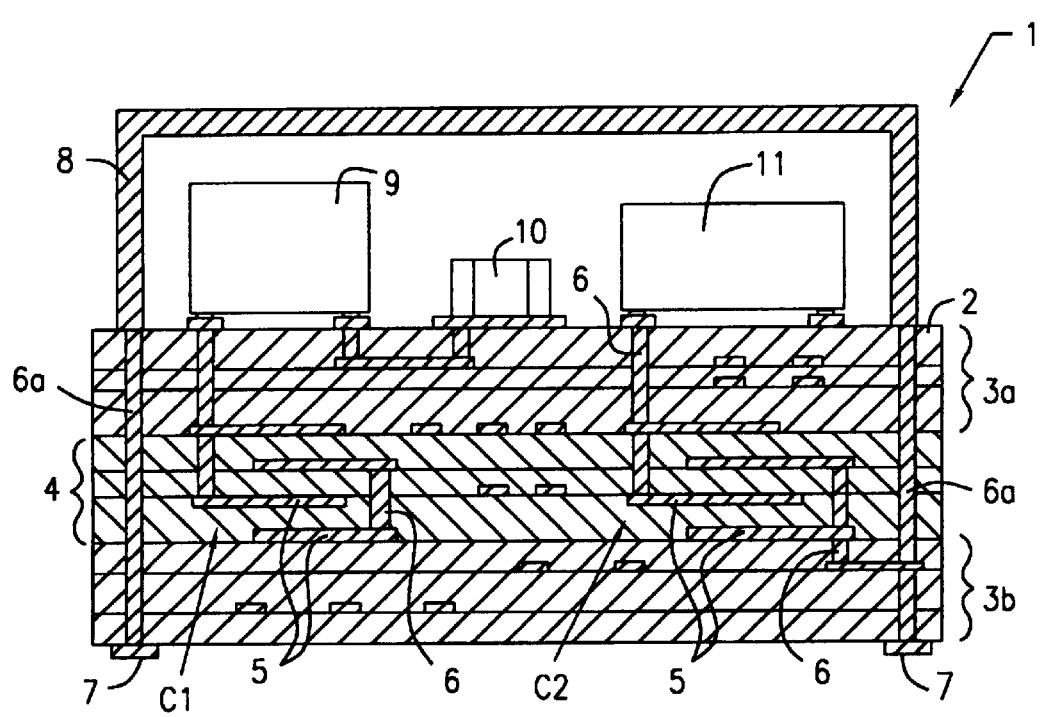
FIG. 3 is a longitudinally sectional view showing a laminated ceramic module as a ceramic electronic part using a multilayer ceramic substrate as an embodiment of the present invention.
Figure 4:
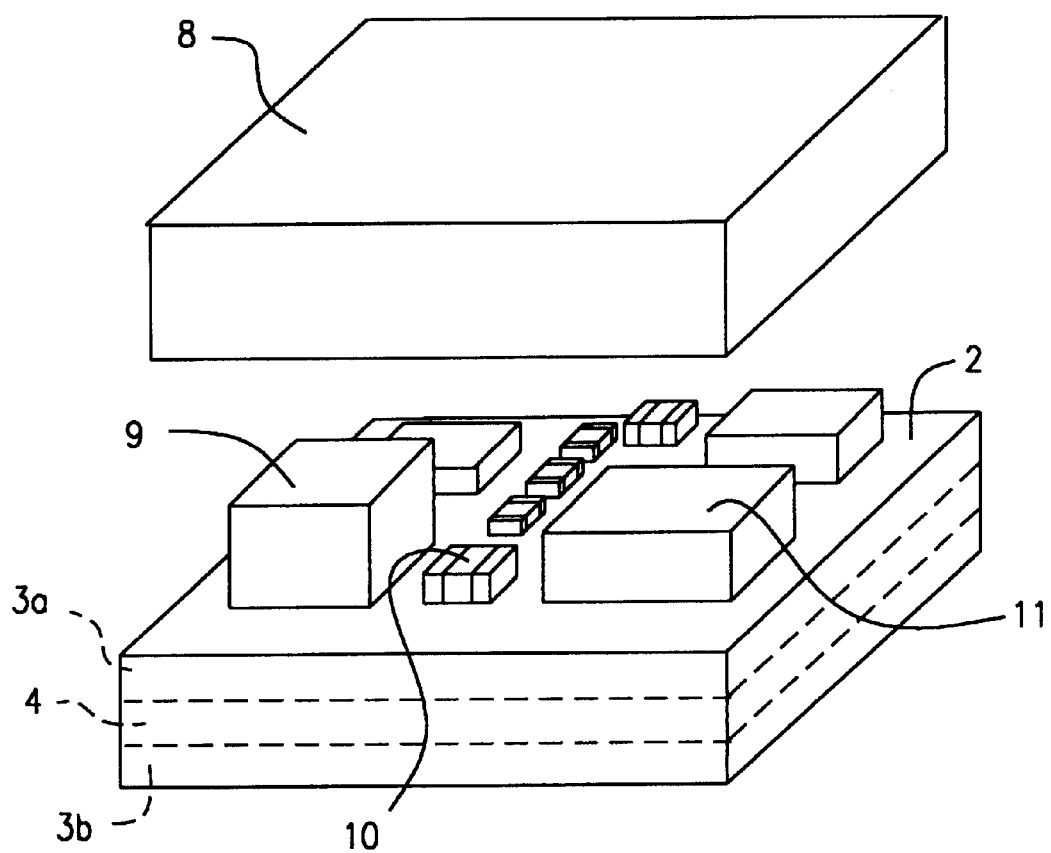
FIG. 4 is an exploded perspective view of the multilayer ceramic module of FIG. 3.

FIG. 3 is a sectional view showing a multilayer ceramic module as a ceramic electronic part including a multilayer ceramic substrate as an embodiment of the present invention, and FIG. 4 is an exploded perspective view thereof.

Multilayer ceramic module 1 is composed by the use multilayer ceramic substrate 2.

Multilayer ceramic substrate 2 includes insulating ceramic layers 3a and 3b each composed of the invented insulating ceramic, and dielectric ceramic layer 4 sandwiched between insulating ceramic layers 3a and 3b. Dielectric ceramic layer 4 is composed of, for example, barium titanate with a glass and has a high dielectric constant.

Inside dielectric ceramic layer 4, a plurality of inner electrodes 5 are arrayed so as to be adjacent to each other via part of dielectric ceramic layer 4, to thereby constitute laminated capacitor units C1 and C2.

Insulating ceramic layers 3a and 3b and dielectric ceramic layer 4 include a plurality of via hole electrodes 6 and 6a and inner wiring.

Separately, electronic part devices 9 through 11 are mounted on a top face of the multilayer ceramic substrate. Semiconductor devices, chip-type laminated capacitors and other appropriate electronic part devices can be used as electronic part devices 9 through 11. Via-hole electrode 6 and the inner wiring electrically connect electronic part devices 9 through 11 to capacitors C1 and C2 to thereby constitute a circuit of the multilayer ceramic module 1 according to the present embodiment.

Conductive cap 8 is fixed on a top face of multilayer ceramic substrate 2. Conductive cap 8 is electrically connected to via-hole electrode 6a which penetrates multilayer ceramic substrate 2 from top to bottom. Outer electrodes 7,7 are formed on an underside of multilayer ceramic substrate 2 and are electrically connected to via-hole electrodes 6 and 6a. Other outer electrodes, not shown in the figure, are only formed on the underside of multilayer ceramic substrate 2 and are electrically connected via the inner wiring to electronic part devices 9 through 11 and/or capacitor units C1 and C2.

The formation of outer electrodes 7 for the connection to outside on the underside alone of multilayer ceramic substrate 2 allows the surface mounting of laminated ceramic modules on, for example, printed circuit boards by use of the underside.

According to the present embodiment, cap 8 is composed of a conductive material and is electrically connected via via-hole electrode 6a to outer electrode 7, to thereby electromagnetically shield electronic part devices 9 through 11. However, cap 8 is not necessarily composed of a conductive material.

Insulating ceramic layers 3a and 3b in multilayer ceramic module 1 according to the present embodiment include the invented insulating ceramic and therefore exhibit a low dielectric constant and a high Q-value, and a multilayer ceramic module 1 suitable for use at high frequencies can be obtained. In addition, insulating ceramic layers 3a and 3b are satisfactory in mechanical strength, and the resulting multilayer ceramic module 1 is also satisfactory in mechanical strength.

Multilayer ceramic substrate 2 can be easily obtained by known techniques for monolithically firing ceramic laminates. Specifically, ceramic green sheets mainly containing insulating ceramic materials according to the present invention are initially prepared, electrode patterns are printed for constituting, for example, inner electrode 5, outer wiring and via-hole electrode 6 and 6a, and the patterned ceramic green sheets are laminated. An appropriate number of plies of the patterned ceramic green sheets for the formation of the outer wiring and via-hole electrodes 6 and 6a are laminated onto a ceramic green sheet, on the top and under sides of which insulating ceramic layers 3a and 3b are to be formed. The resulting laminate is then pressurized in a thickness direction. The thus-prepared laminate is fired to thereby easily yield multilayer ceramic substrate 2.

In laminated capacitor units C1 and C2, a highly dielectric insulating ceramic layer is sandwiched between inner electrodes 5, 5 which are adjacent to each other in a thickness direction for yielding a capacitance, and such inner electrodes having relatively small areas can yield a large capacitance and the resulting device can be further miniaturized.

Figure 5:
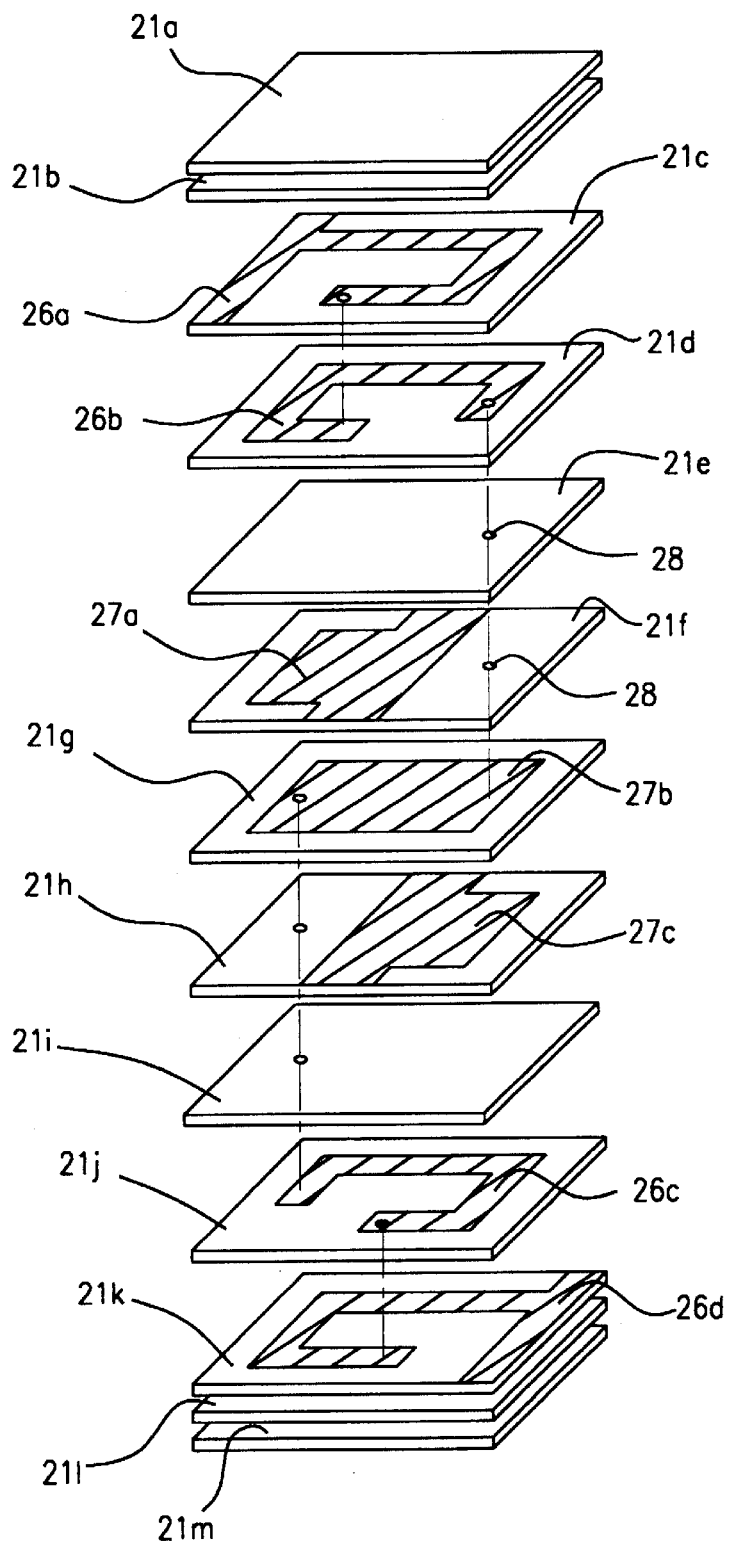
FIG. 5 is an exploded perspective view showing ceramic green sheets and electrode patterns formed thereon for the manufacture of a laminated ceramic electronic part as a second embodiment of the present invention.
Figure 6:
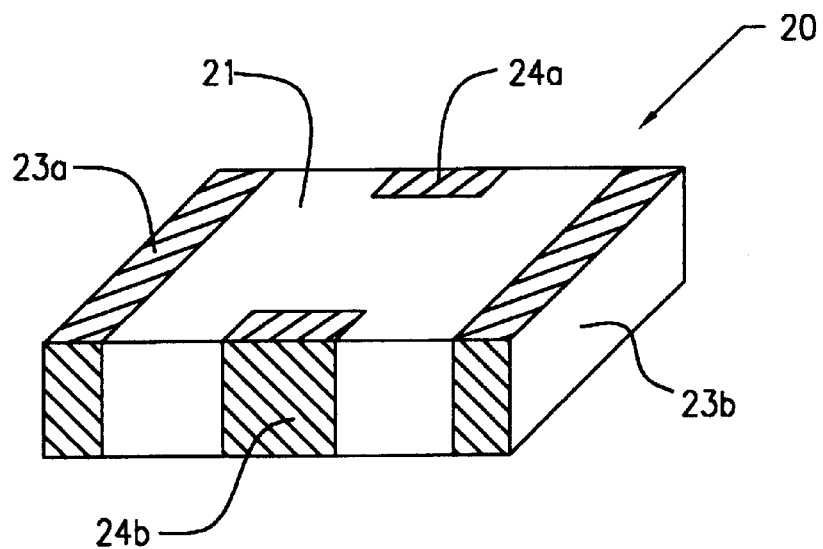
FIG. 6 is a perspective view showing a laminated ceramic electronic part as the second embodiment of the present invention.
Figure 7:
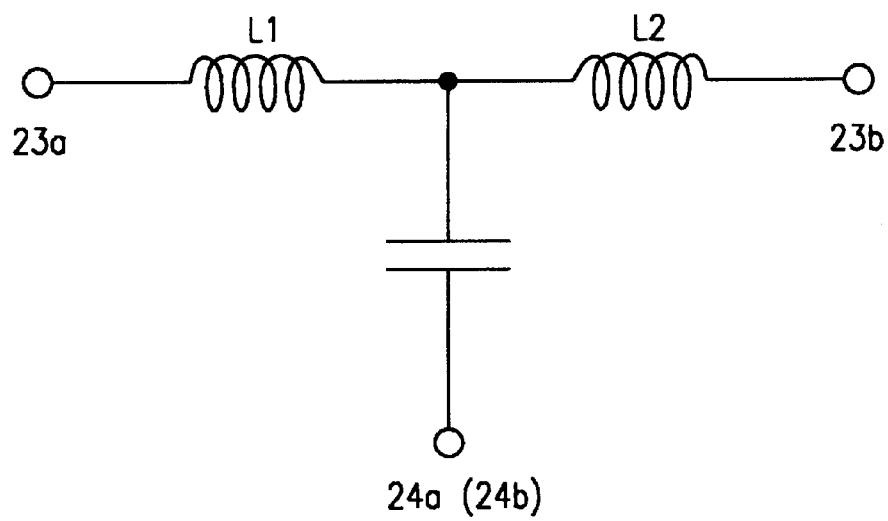
FIG. 7 is a diagram showing the circuitry of the laminated ceramic electronic part of FIG. 6.

FIGS. 5 to 7 are respectively an exploded perspective view, an external perspective view and a circuit diagram showing a laminated ceramic electronic part as a second configurational embodiment of the present invention.

Laminated ceramic electronic part 20 according to this embodiment shown in FIG. 6 is an LC filter including sintered ceramic 21, and a circuit formed inside sintered ceramic 21. The circuit constitutes an inductance L and a capacitance C as described below. Sintered ceramic 21 is composed by the use of the invented insulating ceramic. Outer electrodes 23a, 23b, 24a 24b are formed on an outer surface of the sintered ceramic 21, and an LC resonant circuit shown in FIG. 7 is formed between outer electrodes 23a, 23b, 24a and 24b.

The configuration of sintered ceramic 21 will be illustrated in further detail by showing a manufacturing process thereof with reference to FIG. 5.

Initially, an organic vehicle is added to insulating ceramic materials according to the present invention to yield a ceramic slurry. The ceramic slurry is molded by an appropriate sheet molding technique to yield a ceramic green sheet. The prepared ceramic green sheet is dried and is punched to a given size to yield rectangular ceramic green sheets 21a through 21m.

Next, a via hole for the formation of via hole electrode 28 is formed on ceramic green sheets 21a through 21m according to necessity. Further, a conductive paste is printed according to a screen process to form coil conductors 26a and 26b, capacitor inner electrodes 27a to 27c, and coil conductors 26c and 26d, and the via hole for via hole 28 is filled with the conductive paste to thereby form via hole electrode 28.

Subsequently, the ceramic green sheets are laminated in a direction shown in the figure, and are pressurized in a thickness direction to yield a laminate.

The resulting laminate is fired to yield sintered ceramic 21.

Outer electrodes 23a to 24b are formed on above-prepared sintered ceramic 21 as shown in FIG. 6 by, for example, techniques for the formation of thin films such as application and baking of conductive pastes, vapor deposition, plating or sputtering. Thus, laminated ceramic electronic part 20 is obtained.

As is apparent from FIG. 5, the coil conductors 26a and 26b constitute an inductance unit L1, and the coil conductors 26c and 26d constitute an inductance unit L2, and the inner electrodes 27a to 27c constitute a capacitor C shown in FIG. 7.

The LC filter in laminated ceramic electronic part 20 according to the present embodiment has the aforementioned configuration. Sintered ceramic 21 is composed of the invented insulating ceramic and can therefore be obtained by firing at low temperatures as in multilayer ceramic substrate 2 according to the first embodiment. Accordingly, the ceramic can be monolithically fired with copper, silver, gold and other low-melting metals as coil conductors 26a to 26c as inner electrodes and capacitor inner electrodes 27a to 27c. In addition, the resulting LC filter has a high relative dielectric constant and a high Q-value at high frequencies and is hence suitable for use at high frequencies. Furthermore, the insulating ceramic is high in mechanical strength, and the resulting LC filter is satisfactory also in mechanical strength.

The invented insulating ceramic is prepared by mixing and firing MgO—$MgAl_2O_4$ ceramic and a borosilicate glass, in which a $MgAl_2O_4$ crystal phase and at least one of $Mg_3B_2O_6$ and $Mg_2B_2O_5$ crystal phases are deposited as major crystal phases. The insulating ceramic can be obtained by firing at low temperatures of 1000° C. or less and, therefore has a high Q-value and satisfactory mechanical strengths. The ceramic can therefore be sintered in conjunction with Cu, Ag and other low-resistance low-cost metals, and these metals can be used as materials for inner electrodes in multilayer ceramic substrates and laminated ceramic electronic parts. Thus, the invented insulating ceramic can provide multilayer ceramic substrates and laminated ceramic electronic parts which have a high mechanical strength, a high Q-value and are available at low cost.

When the borosilicate glass includes boron oxide, silicon oxide, magnesium oxide and an alkali metal oxide, the $MgAl_2O_4$ crystal phase and $Mg_3B_2O_6$ crystal phase and/or $Mg_2B_2O_5$ crystal phases can be more reliably deposited as major crystal phases to thereby yield a high Q-value.

An insulating ceramic having a high mechanical strength and a high Q-value can be further stably obtained when the borosilicate glass includes boron oxide, silicon oxide, magnesium oxide and an alkali metal oxide in the above specified proportions.

The borosilicate glass has an increased chemical stability and the invented insulating ceramic can be more stably obtained by firing at low temperatures of 1000° C. or less when the borosilicate glass includes about 20% by weight or less of aluminium oxide.

The glass has a decreased fusing temperature to thereby yield an insulating ceramic which can be obtained by firing at lower temperatures when the borosilicate glass containing about 30% by weight or less of zinc oxide.

The borosiliciate glass, if it includes about 10% by weight or less of copper oxide, can provide the invented insulating ceramic by firing at lower temperatures without deterioration in Q-value.

When the weight ratio of the MgO—$MgAl_2O_4$ ceramic to the borosilicate glass is in a range from about 20:80 to 80:20, the resulting insulating ceramic can have a high Q-value and can become sufficiently dense by firing at low temperatures of 1000° C. or less.

The insulating ceramic can become sufficiently dense by firing at low temperatures of 1000° C. or less when the MgO—$MgAl_2O_4$ ceramic is represented by xMgO—$yMgAl_2O_4$ wherein x is about 10 to 90 and y is about 10 to 90. Thus, the insulating ceramic can be obtained by firing without requiring excess amounts of the glass and can surely exhibit a high Q-value.

The insulating ceramic has a satisfactory sinterability and a high reliability when about 5 to 80% by weight of $MgAl_2O_4$ crystal phase, and about 5 to 70% by weight of $Mg_3B_2O_6$ crystal phase and/or $Mg_2B_2O_5$ crystal phase are deposited in the invented insulating ceramic.

The invented multilayer ceramic substrate includes a ceramic plate containing an insulating ceramic layer composed of the invented insulating ceramic and can be obtained by firing at low temperatures and can employ Ag, Cu and other low-resistance low-cost metals as materials for inner electrodes. In addition, the insulating ceramic layer is high in mechanical strength and has a high Q-value and can yield a multilayer ceramic substrate suitable for use at high frequencies.

The present invention is illustrated with reference to the first and second configurational embodiments by taking multilayer ceramic module 1 and laminated ceramic electronic part 20 constituting an LC filter as example. However, the invented ceramic electronic part and laminated ceramic electronic part should not be limited to these configurations. Specifically, the invention can be applied to multilayer ceramic substrates for multi-chip modules, multilayer ceramic substrates for hybrid integrated circuits (hybrid ICs), and other various multilayer ceramic substrates, and to various ceramic electronic parts including electronic part devices mounted on these multilayer ceramic substrates, as well as to chip-type laminated capacitors, chip-type laminated dielectric antennas, and other various chip-type laminated electronic parts.

When the multilayer ceramic substrate further comprises a second ceramic layer laminated to at least one side of the insulating ceramic layer and the second ceramic layer has a higher dielectric constant than the insulating ceramic layer, the strength and resistance to environmental conditions can be appropriately controlled according to necessity by modifying the composition and the form of lamination of the second ceramic layer.

The invented insulating ceramic has a lower dielectric constant and a higher Q-value and is suitable for use at high frequencies when a plurality of inner electrodes are laminated via at least part of the insulating ceramic layer to thereby constitute a laminated capacitor.

In addition, the invented insulating ceramic is high in mechanical strength and can yield a laminated capacitor having satisfactory mechanical strengths.

When the plurality of inner electrodes include a plurality of inner electrodes constituting a laminated capacitor, and a plurality of coil conductors connected to each other to thereby constitute a laminated inductor, a miniaturized LC resonant circuit suitable for use at high frequencies can be easily obtained, as the invented insulating ceramic has a low dielectric constant and exhibits a high Q-value at high frequencies and is high in mechanical strength.

The invented ceramic electronic part including at least one electronic part device laminated on the invented multilayer ceramic substrate can yield various miniaturized ceramic electronic parts suitable for use at high frequencies, by using the electronic part device and a circuitry in the multilayer ceramic substrate.

When a cap is fixed on the multilayer ceramic substrate so as to surround the electronic part device, the cap can protect the electronic part device and the resulting ceramic electronic part is satisfactory in moisture resistance and other properties.

The use of a conductive cap as the cap can electromagnetically shield the surrounded electronic part device.

The multilayer ceramic substrate can be easily mounted on the surface of a printed circuit board from the underside of the multilayer ceramic substrate when outer electrodes are only formed on the underside of the multilayer ceramic substrate.

The invented laminated ceramic electronic part includes a plurality of inner electrodes formed inside the invented insulating ceramic and can be obtained by firing at low temperatures and can employ Ag, Cu and other low-resistance low-cost metals as materials for inner electrodes. In addition, the insulating ceramic has a low dielectric constant and a high Q-value to thereby yield a laminated capacitor suitable for use at high frequencies. The insulating ceramic is high in mechanical strength and can constitute a laminated capacitor having satisfactory mechanical strengths.

The invented laminated ceramic electronic part is suitable for use at high frequencies when the plurality of inner electrodes constitute a laminate capacitor, as the invented insulating ceramic has a low dielectric constant and a high Q-value.

The invented laminated ceramic electronic part can easily constitute a miniaturized LC resonant circuit which has a high mechanical strength and is suitable for use at high frequencies when the plurality of inner electrodes include inner electrodes constituting a laminated capacitor, and coil conductors constituting a laminated inductor. This is because the invented insulating ceramic is high in mechanical strength and has a low dielectric constant and a high Q-value at high frequencies as described above.

Other embodiments and variations will be obvious to those skilled in the art, and this invention is not to be limited to the specific matters stated above.

What is claimed is:

1. An insulating ceramic comprising a fired mixture of a $MgO$—$MgAl_2O_4$ ceramic and a borosilicate glass, in which fired mixture a $MgAl_2O_4$ crystal phase and at least one of a $Mg_3B_2O_6$ crystal phase and a $Mg_2B_2O_5$ crystal phase are the major crystal phases.

2. An insulating ceramic according to claim 1, wherein said borosilicate glass comprises boron oxide, silicon oxide, magnesium oxide and an alkali metal oxide.

3. An insulating ceramic according to claim 2, wherein said borosilicate glass comprises about 15 to 65% by weight of boron oxide in terms of $B_2O_3$, about 8 to 50% by weight of silicon oxide in terms Of $SiO_2$, about 10 to 45% by weight of magnesium oxide in terms of MgO, and 0 to about 20% by weight of an alkali metal oxide in terms of an oxide.

4. An insulating ceramic according to claim 3, wherein said borosilicate glass further comprises about 20% by weight or less of aluminium oxide.

5. An insulating ceramic according to claim 3, wherein said borosilicate glass further comprises about 30% by weight or less of zinc oxide.

6. An insulating ceramic according to claim 3, wherein said borosilicate glass further comprises about 10% by weight or less of copper oxide.

7. An insulating ceramic according to claim 1, comprising said $MgO$—$MgAl_2O_4$ ceramic and said borosilicate glass are in weight ratio from about 20:80 to 80:20.

8. An insulating ceramic according to claim 1, wherein said $MgO$—$MgAl_2O_4$ ceramic is represented by $xMgO$—$yMgAl_2O_4$ where x and y are weight and respectively satisfy $10 \leq x \leq 90$; $10 \leq y \leq 90$; and $x+y=100$.

9. An insulating ceramic according to claim 1, wherein about 5 to 80% by weight of $MgAl_2O_4$ crystal phase, and about 5 to 70% by weight of at least one of $Mg_3B_2O_6$ and $Mg_2B_2O_5$ crystal phases are present.

10. An insulating ceramic according to claim 9, wherein said $MgO$—$MgAl_2O_4$ ceramic is about 20–80 weight percent of the fired mixture and is represented by $xMgO$—$yMgAl_2O_4$ in which x and y are weight and $10 \leq x \leq 90$, $10 \leq y \leq 90$ and $x+y=100$; and wherein said borosilicate glass comprises about 15 to 65% by weight of boron oxide in terms of $B_2O_3$, about 8 to 50% by weight of silicon oxide in terms of $SiO_2$, about 10 to 45% by weight of magnesium oxide in terms of MgO, 0 to about 20% by weight of an alkali metal oxide in terms of an oxide, about 20% by weight or less of aluminium oxide, about 30% by weight or less of zinc oxide and about 10% by weight or less of copper oxide.

11. A multilayer ceramic substrate comprising:
   a ceramic plate comprising an insulating ceramic layer of the insulating ceramic according to claim 1; and
   a plurality of inner electrodes in the insulating ceramic layer of said ceramic plate.

12. A multilayer ceramic substrate according to claim 11, having a second ceramic layer of a higher dielectric constant than said insulating ceramic layer laminated on at least one side of said insulating ceramic layer.

13. A multilayer ceramic substrate according to claim 12, wherein said plurality of inner electrodes are laminated with each other such that at least part of said insulating ceramic layer is disposed between a pair of said inner electrodes to thereby form a laminated capacitor.

14. A multilayer ceramic substrate according to claim 13, wherein said plurality of inner electrodes additionally comprise coil conductors, and said coil conductors are connected to each other to thereby constitute a laminated inductor.

15. A ceramic electronic part comprising:
   the multilayer ceramic substrate according to claim 12; and
   at least one electronic device on said multilayer ceramic substrate and forming a circuit with said plurality of inner electrodes.

16. A ceramic electronic part according to claim 15 further comprising a cap fixed on said multilayer ceramic substrate so as to surround said electronic part device.

17. A ceramic electronic part according to claim 16, wherein said cap is a conductive cap.

18. A ceramic electronic part according to claim 15, further comprising:
- a plurality of outer electrodes disposed on only one side of said multilayer ceramic substrate; and
- a plurality of through-hole conductors in said substrate electrically connected to said outer electrodes and electrically connected to said inner electrode or said electronic device.

19. A laminated ceramic electronic part comprising:
- a sintered ceramic comprising the insulating ceramic according to claim 1;
- a plurality of inner electrodes arrayed inside said sintered ceramic; and
- a plurality of outer electrodes on an outer surface of said sintered ceramic and being electrically connected to at least one of said inner electrodes.

20. A laminated ceramic electronic part according to claim 19 wherein said plurality of inner electrodes are arrayed to overlap each other with at least a part of a ceramic layer therebetween, to thereby constitute a capacitor unit.

21. A laminated ceramic electronic part according to claim 20, wherein said plurality of inner electrodes further comprises a plurality of coil conductors connected to each other to thereby constitute a laminated inductor unit.

* * * * *